June 23, 1959 H. J. WOLL 2,892,164
SEMI-CONDUCTOR FILTER CIRCUITS
Filed Oct. 27, 1954
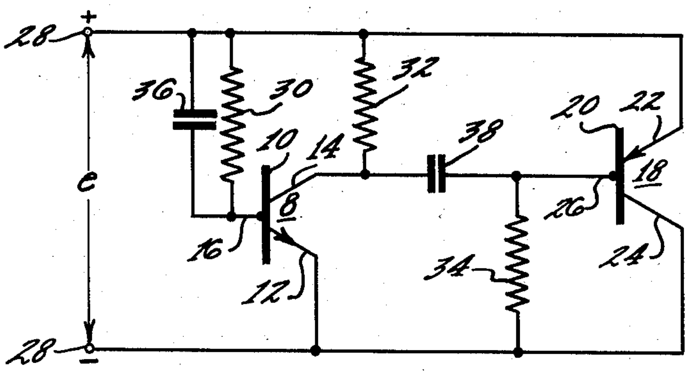
INVENTOR.
Harry J. Woll
BY H. L. Newton
ATTORNEY.

2,892,164
Patented June 23, 1959

2,892,164

SEMI-CONDUCTOR FILTER CIRCUITS

Harry J. Woll, Haddon Heights, N.J., assignor to Radio Corporation of America, a corporation of Delaware Application October 27, 1954, Serial No. 464,995
8 Claims. (Cl. 333—80)

This invention relates in general to semi-conductor filter circuits, and in particular to filter circuits utilizing opposite conductivity transistors for removing alternating current components from a direct current voltage.

Power supplies are generally required to supply a source of direct current potential by rectification from an alternating current line which is relatively free of alternating current components. Generally, however, a power supply rectifier provides a voltage which contains alternating current components in addition to the direct current voltage which is desired. These undesired alternating current components are referred to as "ripple" and their magnitude is defined by the ripple factor. In order to attenuate these ripple components, it is the general practice to connect some form of filtering means in circuit between the rectifier and the output.

Filter circuits for attenuating the ripple are well known. Often a capacitor is connected across the load which is charged when the rectifier conducts and discharges in the intervals between pulses from the rectifier. To provide effective filtering action, a large capacitor is required. A relatively large inductance, such as a choke coil, may be connected in series with the load to suppress ripple. Choke coils are large and bulky, however. Other filters use various circuit combinations of both inductors and capacitors. These filters are also space consuming.

Filter circuits in accordance with this invention utilize semi-conductor signal amplifying devices such as transistors to provide an effective means for removing the ripple components from a direct current voltage. Signal amplifying devices of the electron discharge type (i.e., vacuum tubes) have been used to remove ripple, generally with several tubes and relatively complicated circuits. Transistors, however, as distinguished from electron discharge devices may be of opposite conductivity or complementary symmetry types as disclosed, for example, in an article by George C. Sziklai in the June 1953 "Proceedings of the I.R.E.," pages 717–724. This characteristic of transistors, for which there is no known electron discharge tube equivalent, is utilized in accordance with the present invention to provide improved filter circuits for removing alternating current components from a direct current voltage.

It is, accordingly, an object of the present invention to provide an improved filter circuit for removing alternating current components from a direct current voltage or current supply circuit which utilizes transistors of opposite conductivity types.

It is another object of the present invention to provide an improved filter circuit effectively utilizing semi-conductor signal amplifying devices to provide simplified construction and small size.

It is a still further object of the present invention to provide an improved and efficient filter circuit for removing ripple from a direct current power supply circuit which is relatively small in size and reliable in operation.

It is yet another object of the present invention to provide an improved filter circuit effectively utilizing a pair of transistors of opposite conductivity types which is small in size and which efficiently and effectively attenuates ripple voltages present in a source of direct current voltage.

These and further objects and advantages of the present invention are achieved, in general, by a circuit which utilizes a pair of opposite conductivity transistors connected to form a two-terminal device having a high direct current resistance and a low alternating current impedance. The transistors are so connected that the ripple voltage which is applied to the terminals of the circuit is amplified and a current is fed back in such a manner that the ripple voltage is effectively cancelled. In this manner efficient and reliable ripple attenuation is accomplished by a circuit which occupies a minimum of space.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which the figure is a schematic circuit diagram of a filter circuit utilizing a pair of opposite conductivity type transistors in accordance with the invention:

Referring now to the drawing, wherein like parts are indicated by like reference numerals, a two-terminal shunt filter in accordance with the invention comprises two transistors 8 and 18. The transistor 8 may be considered to be an N–P–N junction type transistor while the transistor 18 may be considered to be a P–N–P junction type transistor. It should be understood, however, that other types of transistors having characteristics similar to the characteristics of junction transistors could be used equally well.

Each of the transistors comprises a semi-conductive body, with which three electrodes are cooperatively associated in a well known manner. Thus, the N–P–N transistor 8 includes a semi-conductive body 10 and an emitter 12, a collector 14 and a base 16. Similarly, the P–N–P junction transistor 18 has a semi-conductive body 20 and an emitter 22, a collector 24 and a base 26.

The filter circuit embodying the invention includes a pair of input terminals 28 to which may be applied a direct current polarizing voltage as well as the unwanted alternating current component or ripple voltage ($e$). The circuit arrangement is such that the polarity of the polarizing voltage is proper for biasing each of the transistors in the conventional manner for normal transistor action. That is, each of the collectors will be biased in the relatively non-conducting or reverse direction with respect to their respective base electrodes, while each of the emitters will be biased in the relatively forward or conducting direction with respect to their respective base electrodes. Thus, for a transistor of P type conductivity (i.e., an N–P–N junction transistor) this means that the collector will be positive with respect to the base while the emitter will be negative with respect to the base. For a transistor of N type conductivity (i.e., a P–N–P junction transistor) on the other hand, the collector will be negative with respect to the base while the emitter will be positive with respect to the base.

To apply ripple currents to the N–P–N transistor 8, its signal input path includes a capacitor 36 which is connected in series between the base 16 and the upper or positive input terminal 28 for the circuit. A biasing resistor 30 is also connected in series between the upper or positive input terminal of the circuit and the base 16. The emitter 12 of the N–P–N transistor 8 is returned directly to the negative input terminal 28.

An alternating current signal path is provided between the collector of the N–P–N transistor 8 and the base 26 of the P–N–P transistor 18 by means of a coupling capacitor 38 which is connected in series between the collector 14 of the N–P–N transistor 8 and the base 26 of the P–N–P transistor 18. The collector 14 of the N–P–N transistor 8 is connected to the positive input terminal 28 through a resistor 32, while the base 26 of the P-N-P transistor 18 is connected to the negative input terminal through a resistor 34. The circuit connections are completed by connecting the emitter 22 of the P-N-P transistor to the positive terminal of the supply, while the collector 24 is returned to the negative input terminal. As described, it is evident that the circuit connections are such that the polarity of the direct current voltages which are applied to the electrodes of each of the transistors are the same as those described above for normal transistor action. Since opposite conductivity transistors are used in accordance with the invention, the circuit connections required are relatively simple and the proper filtering action is achieved with but two transistors.

In operation, the small portion of ripple current which flows from the terminals 28 into the base 16 of the N-P-N transistor 8 will result in an amplified current which flows into the collector 14. The magnitude of the current flow into the collector 14 is determined by the current gain of the N-P-N transistor 8. In turn the major portion of this current flows out of the base 26 of the P-N-P transistor 18, resulting in amplified current flow into the emitter 22. The magnitude of the current flowing into the emitter 22 is determined by the current gain of the P-N-P transistor 18. Thus, the application of a small ripple voltage across the input terminals 28 produces an increment of ripple current at the base 16 which results in a comparatively large flow of ripple current between the terminals 28. Thus, the circuit provides a low alternating current impedance and effectively attenuates the undesired alternating current ripple component. To effectively attenuate the undesired ripple voltage from a direct current supply, the filtering means, such as a capacitor, should have a high direct current resistance so as not to waste power as well as a low alternating current impedance so that the ripple component is effectively shunted to ground. In operation, it can be shown that two-terminal circuits embodying the invention are characterized by this required high direct current resistance and low alternating current impedance, thus providing effective filtering action, if it is assumed, for example, that an alternating current voltage, such as a ripple voltage ($e$), is applied between the input terminals 28 of the circuit. A current ($i_{b_1}$) will then flow through the capacitor 36 into the base 16 of the transistor 8.

The current induced by the ripple voltage ($e$), and which flows into the base 16, will be approximately equal to the applied ripple voltage ($e$) divided by the base input resistance of the transistor 8. If it is assumed that the base input resistance of the transistor 8 is a typical value of 500 ohms, this current ($i_{b_1}$) will be approximately:

$$i_{b_1}=\frac{e}{500}$$

The N-P-N transistor 8 is a current amplifying device having a current gain ($\alpha_{cb_1}$) between its collector and base electrodes. Accordingly, a current ($i_{b_2}$) will flow out of the base 26 of the P-N-P transistor 18 which will be equal to:

$$i_{b_2}=(\alpha_{cb_1})\ (i_{b_1})$$

The P-N-P transistor 18 is also a current amplifying device having a current gain ($\alpha_{cb_2}$) between its collector and base electrodes. Accordingly, a current ($i_{c_2}$) will flow out of the collector 24 of the P-N-P transistor 18 which will be approximately equal to:

$$i_{c_2}=\frac{(\alpha_{cb_1})(\alpha_{cb_2})e}{500}$$

The input impedance (Z) of the entire filter circuit, measured at its input terminals 28 will then be approximately equal to:

$$Z=\frac{500}{(\alpha_{cb_1})(\alpha_{cb_2})}$$

A typical value for the current gain of a junction transistor may be considered to be 40. Accordingly, the input impedance of the filter circuit embodying the invention will be approximately equal to:

$$Z=\frac{500}{(40)(40)}=0.31 \text{ ohm}$$

At a frequency of 60 cycles per second the impedance of a 10,000 microfarad capacitor is equal to approximately one-third of an ohm. Thus, by provision of the present invention, the alternating current impedance of a 10,000 microfarad capacitor at a frequency of 60 cycles per second may be obtained with a circuit employing but two transistors. Moreover, the direct current resistance of the filter circuit is relatively high and may be determined by the operating points of the transistors. The operating points are, in turn, determined by the amount of ripple current which it is desired to handle. As described, therefore, a shunt filter circuit embodying the invention provides effective and efficient filtering action of unwanted ripple voltages, yet occupies, since only two transistors are needed, a minimum of space.

In the embodiment of the invention illustrated, the transistor 8 is of the N-P-N junction type while the transistor 18 is of the P-N-P junction type. It should be understood, however, that the conductivity of the transistors may be reversed. If this is done, the polarity of the direct current voltage would also have to be reversed.

While it will be understood that the circuit specifications may vary according to the design for any particular application, the following circuit specifications are included by way of example only:

| | |
|---|---|
| Transistor **8** | RCA type 2N35. |
| Transistor **18** | RCA type 2N34. |
| Resistors **30**, **32** and **34** | 4,700; 4,700; and 390,000 ohms respectively. |
| Direct current polarizing voltage | 10 volts. |

As described herein, a shunt filter circuit is characterized by efficient and reliable filtering action and occupies a minimum of space. As a result, filter circuits embodying the invention should find widespread use wherever small size is required or desired, yet effective filtering action must be maintained.

What is claimed is:

1. In a semi-conductor filter circuit, the combination with a first transistor of one conductivity type including a first base, a first emitter and a first collector electrode, and a second transistor of an opposite conductivity type including a second base, a second emitter and a second collector electrode, of a first and a second input terminal, said first and second input terminals being the sole external terminals for said filter circuit, a first capacitor connected in series between said first terminal and said first base electrode, a first resistor connected in series between said first terminal and said first base electrode, means connecting said first emitter electrode with said second terminal, a second resistor connected in series between said first collector electrode and said first terminal, means including a capacitor serially connected between said first collector and second base electrodes, a third resistor connected in series between said second base electrode and said second terminal, circuit means connecting said second emitter electrode with said first terminal, and means connecting said second collector electrode with said second terminal.

2. A two-terminal semi-conductor filter circuit for filtering the ripple components of an unfiltered direct current voltage comprising, in combination, a first and a second input terminal providing connections for said direct current voltage, said first and second input terminals being the sole external terminals for said filter circuit, a pair of opposite conductivity type transistors connected to provide a low alternating current impedance and high direct current impedance to filter said ripple components, each of said transistors including a base, an emitter, and a collector electrode, means connecting said input terminals with said transistors for applying said unfiltered direct current voltage containing unwanted ripple components from said first and second terminals to said transistors to provide the sole biasing source therefor for biasing each of said emitter electrodes in a relatively conducting direction with respect to its respective base electrode and each of said collector electrodes in a relatively non-conducting direction with respect to its respective base electrode, means providing an alternating current signal path between said first terminal and the base electrode of one of said transistors for applying said ripple components thereto, and means coupling the collector electrode of said one of said transistors with the base electrode of the other of said transistors.

3. A semi-conductor filter circuit for filtering alternating current ripple components from a direct current supply voltage comprising, a first and a second input terminal providing connections for said supply voltage, said first and second input terminals being the sole external terminals for said filter circuit, a first semi-conductor device of one conductivity type including a first base, a first emitter and a first collector electrode, a second semiconductor device of an opposite conductivity type including a second base, a second emitter and a second collector electrode, means connecting said semi-conductor devices to provide a low alternating current impedance and high direct current impedance for filtering said alternating current ripple components including conductive circuit means connecting said first emitter electrode and said second collector electrode with said first terminal and said first collector electrode and said second emitter electrode with said second terminal, means providing an alternating current signal path connected between said first terminal and said first base electrode for applying the unwanted alternating current component of said direct current supply voltage thereto, and means coupling said first collector electrode with said second base electrode.

4. A two-terminal semi-conductor filter circuit for filtering the ripple components of a direct current voltage comprising, in combination, a pair of opposite conductivity type transistors each of which includes a base, an emitter and a collector electrode, a pair of input terminals providing connections for said direct current voltage, said pair of input terminals being the sole external terminals for said filter circuit, means for applying said direct current voltage from said terminals to the electrodes of said transistors and providing the sole biasing source therefor, means connecting said transistors to provide a low alternating current impedance including a signal coupling path between one of said terminals and the base electrode of one of said transistors for applying said ripple components thereto, and alternating current coupling means connecting the collector electrode of said one of said transistors with the base electrode of the other of said transistors.

5. In a semi-conductor filter circuit for filtering the alternating current components of a direct current voltage, the combination comprising, a first and a second input terminal providing connections for said direct current voltage, said first and second input terminals being the sole external terminals for said filter circuit, a first and a second semi-conductor signal amplifying device of opposite conductivity types each including base, emitter and collector electrodes, means connecting said first terminal with the collector of said first device and the emitter of said second device and said second terminal with the emitter of said first device and the collector of said second device for applying said direct current voltage thereto and providing the sole source of biasing voltages for said electrodes, means providing an alternating current signal path connected between said first input terminal and the base electrode of said first device for applying said alternating current components thereto, and means coupling the collector electrode of said first device with the base electrode of said second device, said filter circuit providing a relatively low impedance to said alternating current and a relatively high resistance to direct current to filter said alternating current components.

6. In a semi-conductor filter circuit for removing alternating current components from a direct current supply voltage, the combination with a first and a second input terminal providing connections for said supply voltage, said first and second input terminals being the sole external terminals for said filter circuit, of first and second cascade connected semi-conductor devices of opposite conductivity types each including base, emitter and collector electrodes, conductive circuit means connecting the emitter electrode of said first device and the collector electrode of said second device with said first terminal and the collector electrode of said first device and the emitter electrode of said second device with said second terminal, and means providing an alternating current signal path connected between said second terminal and the base electrode of said first device for applying said alternating current components thereto, said filter circuit providing a relatively low impedance to said alternating current and a relatively high resistance to direct current.

7. A semi-conductor filter circuit comprising, in combination, means providing a first and a second input terminal, said first and second input terminals being the sole external terminals for said filter circuit, means for applying an unfiltered direct current voltage containing unwanted ripple components to said terminals, a first transistor of one conductivity type including first, second, and third electrodes, a second transistor of an opposite conductivity type including fourth, fifth, and sixth electrodes, means connecting said transistors to provide a low alternating current impedance including means providing an alternating current signal path between said first terminal and said first electrode for applying said ripple components to said first electrode, means connecting said third and fifth electrodes with said second terminal and said second and fourth electrodes with said first terminal, and means coupling said second electrode with said sixth electrode.

8. A two-terminal semi-conductor filter circuit comprising in combination, a pair of opposite conductivity type transistor amplifiers connected in cascade to provide a relatively low impedance to alternating current signals and a relatively high impedance to direct current, a pair of terminals providing connections for a source of direct and alternating current ripple voltage, said pair of terminals comprising the sole external terminals for said filter circuit, conductive circuit means connected with said pair of terminals for applying said direct current supply voltage to the electrodes of said transistor amplifiers and providing the sole biasing source therefor, and means connected between one of said terminals and one of said transistor amplifiers for applying said alternating current ripple voltage to said one of said transistor amplifiers.

References Cited in the file of this patent

UNITED STATES PATENTS

| | | |
|---|---|---|
| 2,666,818 | Shockley | Jan. 19, 1954 |
| 2,693,565 | Edwards | Nov. 2, 1954 |
| 2,698,416 | Sherr | Dec. 28, 1954 |
| 2,751,545 | Chase | June 19, 1956 |
| 2,751,548 | Gunderson | June 19, 1956 |
| 2,751,549 | Chase | June 19, 1956 |

OTHER REFERENCES

Electronic Engineering, September 1953, pp. 359, 363.